United States Patent
Kwon et al.

(10) Patent No.: US 7,723,836 B2
(45) Date of Patent: May 25, 2010

(54) CHIP STACK STRUCTURE HAVING SHIELDING CAPABILITY AND SYSTEM-IN-PACKAGE MODULE USING THE SAME

(75) Inventors: Houng-Kyu Kwon, Gyeonggi-do (KR); Jeong-O Ha, Asan-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 31 days.

(21) Appl. No.: 11/546,375

(22) Filed: Oct. 12, 2006

(65) Prior Publication Data

US 2007/0096335 A1 May 3, 2007

(30) Foreign Application Priority Data

Oct. 28, 2005 (KR) .................. 10-2005-0102526

(51) Int. Cl.
*H01L 23/48* (2006.01)
(52) U.S. Cl. .................. 257/690; 257/686; 257/723; 257/660; 257/E25.27; 257/E21.614
(58) Field of Classification Search ............. 257/686, 257/723, 690, E25.27, E21.614; 361/777
See application file for complete search history.

(56) References Cited

U.S. PATENT DOCUMENTS

| | | | |
|---|---|---|---|
| 5,323,060 A | | 6/1994 | Fogal et al. |
| 6,593,647 B2 * | | 7/2003 | Ichikawa .................. 257/686 |
| 2004/0179344 A1 * | | 9/2004 | Uchida et al. ............... 361/777 |
| 2004/0238857 A1 * | | 12/2004 | Beroz et al. ................. 257/232 |
| 2007/0200230 A1 * | | 8/2007 | Chow ......................... 257/723 |

FOREIGN PATENT DOCUMENTS

| | | |
|---|---|---|
| JP | 2003-031760 | 1/2003 |
| KR | 1020010058840 A | 7/2001 |
| KR | 1020020043395 A | 6/2002 |
| KR | 1020030075860 A | 9/2003 |
| KR | 1020040024163 | 3/2004 |
| KR | 1020040025631 A | 3/2004 |

* cited by examiner

*Primary Examiner*—Cuong Q Nguyen
*Assistant Examiner*—Cathy N Lam
(74) *Attorney, Agent, or Firm*—Volentine & Whitt, P.L.L.C.

(57) ABSTRACT

A chip stack structure having a shielding capability may comprise a wiring substrate, the wiring substrate including a ground layer. The structure may also comprise a first chip attached on an upper surface of the wiring substrate and electrically connected to the ground layer. The structure may also comprise a plurality of first bonding wires which electrically connect the first chip to the wiring substrate. The structure may also comprise a shield plate attached to the first chip and detached from at least one of the plurality of first bonding wires, the shield plate being configured to cover the first chip and at least one of the plurality of first bonding wires. The structure may also comprise a grounding wire which connects the shield plate to the ground layer of the wiring substrate. The structure may also comprise a second chip attached to and supported by the shield plate. The structure may also comprise a plurality of second bonding wires which connect the second chip directly or via the shield plate to the wiring substrate.

20 Claims, 9 Drawing Sheets

CHIP STACK STRUCTURE HAVING SHIELDING CAPABILITY AND SYSTEM-IN-PACKAGE MODULE USING THE SAME

BACKGROUND OF THE INVENTION

1. Field of the Invention

The present invention relates generally to a semiconductor package and, more particularly, to a chip stack structure having a plurality of vertically stacked semiconductor chips, and to a system-in-package (SIP) module using the chip stack structure.

A claim of priority is made to Korean Patent Application No. 2005-102526, filed on Oct. 28, 2005, the entire contents of which are incorporated herein by reference.

2. Description of the Related Art

There has been an increase in demand for portable products that require light, thin, and small semiconductor packages functioning as components mounted in these portable products. To cope with this demand, there have been various technology-oriented efforts in the semiconductor packaging industry. For example, one approach attempts to reduce sizes of individual semiconductor packages. Another approach includes using a system-on-chip (SOC) technology for integrating multiple components together in a chip. Yet another approach includes a system-in-package (SIP) technology for integrating multiple semiconductor chips in a package.

The SIP technology permits multiple semiconductor chips to be vertically or horizontally mounted in a package. Furthermore, the SIP technology may be regarded as an extension of a conventional multi-chip module (MCM) technology. While multiple semiconductor chips are normally mounted in a horizontal manner in the MCM technology, they are normally mounted in a vertical manner in the SIP technology.

Figure 1:
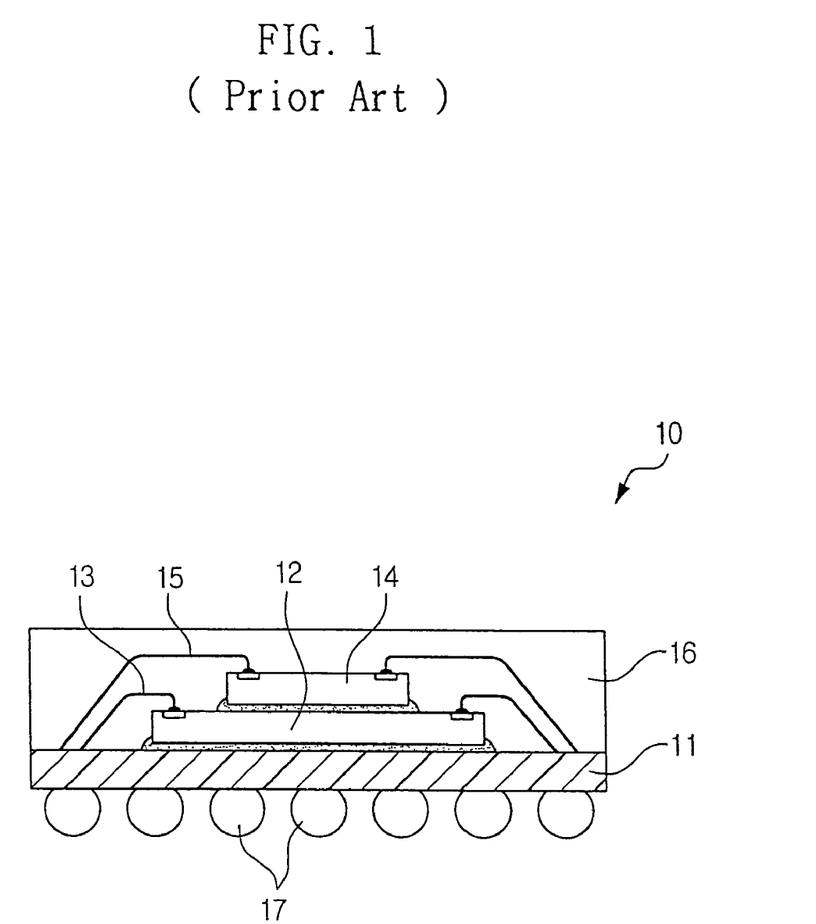
FIG. 1 is a sectional view showing a system-in-package (SIP) module using a conventional chip stack structure.

FIG. 1 represents a prior art SIP module 10. Referring to FIG. 1, SIP module 10 includes two or more stacked semiconductor chips. If a lower chip (a first chip 12) is larger than an upper chip (a second chip 14), the second chip 14 may be directly stacked on the first chip 12. The first chip 12 may be electrically connected to a wiring substrate 11 through first bonding wires 13 and the second chip 14 may be electrically connected to the wiring substrate 11 through second bonding wires 15. The first chip 12 mounted on an upper surface of the wiring substrate 11, the second chip 14, and the first and second bonding wires 13 and 15 may be protected by a molding compound 16. Furthermore, solder balls 17 may be formed at a lower surface of the wiring substrate 11.

In the SIP module 10 having the chip stack structure described above, the first chip 12 and second chip 14 may not be shielded from each other. In addition, the first and second bonding wires 13 and 15 may be formed close to each other. Consequently, signal interference may occur between signals transferred via the first bonding wires 13 and signals transferred via the second bonding wires 15. This signal interference may degrade the performance of the SIP module 10.

Figure 2:
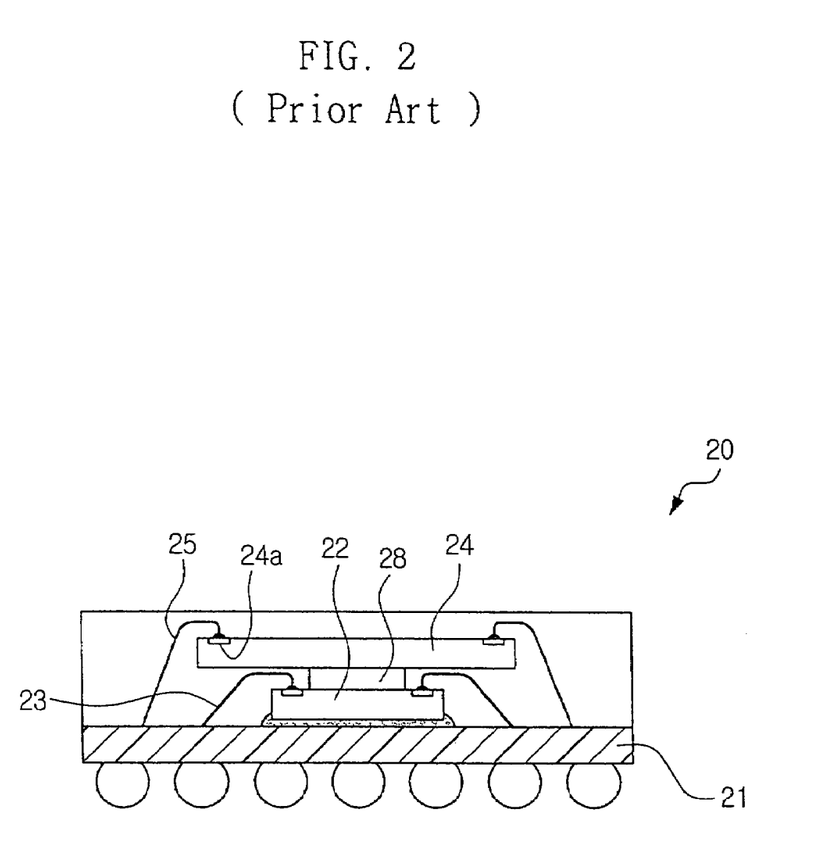
FIG. 2 is a sectional view showing another SIP module using a conventional chip stack structure.

When the second chip has a size greater than or similar to that of the first chip, then, as disclosed in U.S. Pat. No. 5,323,060, there is a need for a spacer between the first and second chips. As shown in FIG. 2, in a SIP module 20 having such a chip stack structure, the spacer 28 acts to suppress electrical interference caused by mechanical contact between first bonding wires 23 connected to a first chip 22 and the lower surface of a second chip 24.

In the SIP module 20, the first chip 22 and second chip 24 are not shielded from each other, and the first bonding wires 23 are exposed to the second chip 24. Consequently, performance of the SIP module 20 may be degraded owing to signal interference between the first chip 22 and second chip 24. In particular, this signal interference may become serious if a semiconductor chip sensitive to external electromagnetic fields, such as, for example, a radio frequency (RF) device, is stacked in the SIP module 20.

When an RF device is stacked in a SIP module, the RF device may be stacked before a baseband device according to the chip stack structure of FIG. 2. That is, the RF device is used as the first chip 22, and the baseband device is used as the second chip 24. Therefore, there is a need to solve problems caused by the signal interference between the RF and baseband devices.

In addition, a portion of the second chip 24 at which second electrode pads 24a are formed is configured in an overhang structure. This overhang structure is not supported by the first chip 22. The lack of support for the overhang structure may affect the wire bonding. For example, in a wire bonding operation, cracks may develop at edge portions of the second chip 24 or the bonding quality of second bonding wires 25 may be degraded. These problems may become more serious with a decrease in thickness of the second chip 24 and an increase in width of the overhang structure. Specifically, in a wire bonding operation for connecting the second chip 24 to a wiring substrate 21, a capillary may apply a predetermined amount of force to the second chip 24 to bond one end of each second bonding wire 25 to a second electrode pad 24a. In particular, when the portion at which the second electrode pads 24a are formed is not supported at the lower part thereof, and is thin, cracks may develop at the edge portions of the second chip 24 because of the force applied by the capillary. Furthermore, when the edge portions of the second chip 24 vibrate owing to a reaction force caused by the action force of the capillary, the quality of bonds between the second electrode pads 24a and second bonding wires 25 may be lowered.

The present disclosure is directed to overcoming one or more of the problems associated with the prior art SIP modules.

SUMMARY OF THE INVENTION

One aspect of the present disclosure includes a chip stack structure having a shielding capability. The chip stack structure may comprise a wiring substrate, the wiring substrate including a ground layer. The structure may also comprise a first chip attached on an upper surface of the wiring substrate and electrically connected to the ground layer. The structure may also comprise a plurality of first bonding wires which electrically connect the first chip to the wiring substrate. The structure may also comprise a shield plate attached to the first chip and detached from at least one of the plurality of first bonding wires, the shield plate being configured to cover the first chip and at least one of the plurality of first bonding wires. The structure may also comprise a grounding wire which connects the shield plate to the ground layer of the wiring substrate. The structure may also comprise a second chip attached to and supported by the shield plate. The structure may also comprise a plurality of second bonding wires which connect the second chip directly or via the shield plate to the wiring substrate.

Another aspect of the present disclosure includes a system-in-package module having a shielding capability. The module may comprise a chip stack structure having a shielding capability. The chip stack structure may comprise a wiring substrate, the wiring substrate including a ground layer. The structure may also comprise a first chip attached on an upper surface of the wiring substrate and electrically connected to the ground layer. The structure may also comprise a plurality of first bonding wires which electrically connect the first chip to the wiring substrate. The structure may also comprise a shield plate attached to the first chip and detached from at least one of the plurality of first bonding wires, the shield plate being configured to cover the first chip and at least one of the plurality of first bonding wires. The structure may also comprise a grounding wire which connects the shield plate to the ground layer of the wiring substrate. The structure may also comprise a second chip attached to and supported by the shield plate. The structure may also comprise a plurality of second bonding wires which connect the second chip directly or via the shield plate to the wiring substrate. The system-in-package module may also comprise a molding compound which encapsulates the first chip stacked on the wiring substrate, the second chip, and the plurality of first and second bonding wires. The system-in-package module may also comprise a plurality of external interface terminals formed outside the molding compound and connected to the wiring substrate.

DETAILED DESCRIPTION OF EXEMPLARY EMBODIMENTS

Hereinafter, exemplary embodiments of the present invention are described in detail with reference to the accompanying drawings.

First Embodiment

Figure 3:
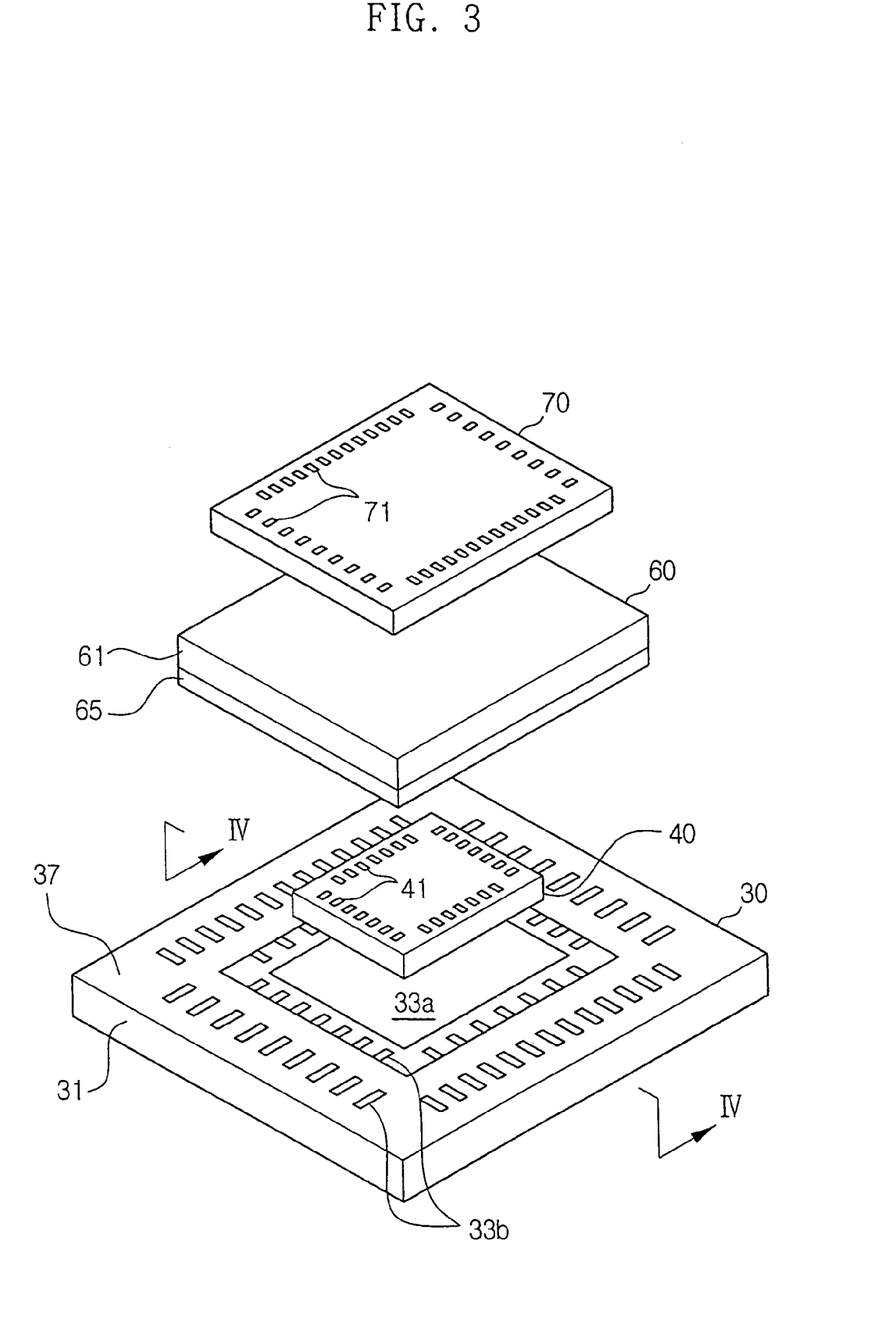
FIG. 3 is an exploded perspective view showing a chip stack structure having a shielding capability according to a first embodiment of the present invention.
Figure 4:
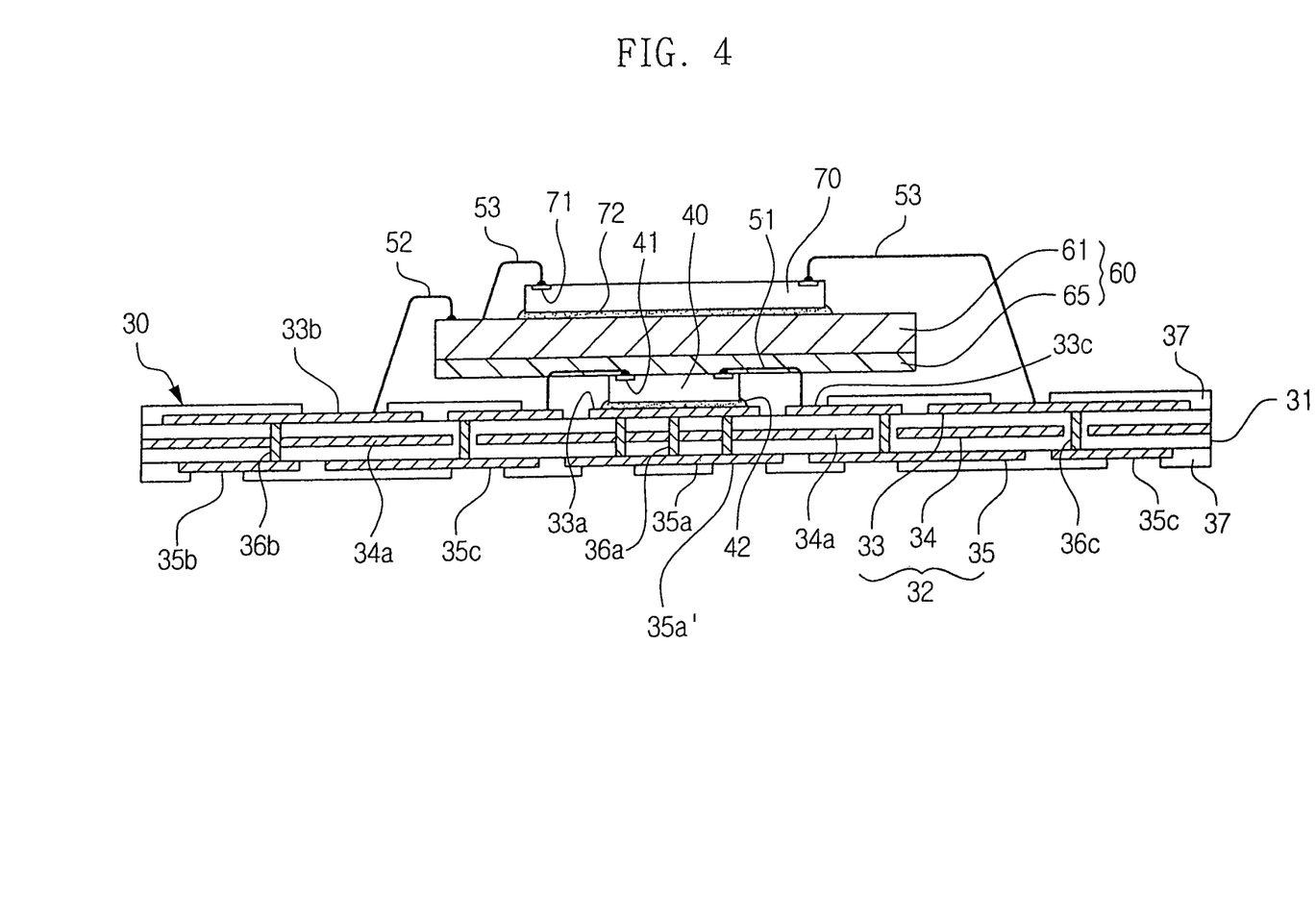
FIG. 4 is a sectional view of the chip stack structure taken along line IV-IV of FIG. 3.

FIG. 3 is an exploded perspective view showing a chip stack structure having a shielding capability according to a first embodiment of the present invention. FIG. 4 is a sectional view of the chip stack structure taken along the line IV-IV of FIG. 3.

Referring to FIGS. 3 and 4, the chip stack structure according to the first embodiment comprises a first chip 40 and a second chip 70 stacked on an upper surface of a wiring substrate 30, and a shield plate 60 disposed between the first chip 40 and second chip 70. The wiring substrate 30 includes a ground layer 34a. The first chip 40 is attached on the upper surface of the wiring substrate 30 and is electrically connected to the ground layer 34a. Specifically, the first chip 40 is electrically connected to the wiring substrate 30 through first bonding wires 51. The shield plate 60 is attached on the first chip 40 and covers both the first chip 40 and the first bonding wires 51 while being detached from the first bonding wires 51. The shield plate 60 is connected to the ground layer 34a of the wiring substrate 30 through a grounding wire 52. The second chip 70 is attached on and supported by the shield plate 60. Second bonding wires 53 connect the second chip 70 directly or via the shield plate 60 to the wiring substrate 30.

In the chip stack structure according to the first embodiment, because the shield plate 60 is grounded to the ground layer 34a and acts to shield the first bonding wires 51 in addition to the first chip 40, signal interference between the first chip 40 and second chip 70 may be suppressed. In addition, because the second chip 70 is supported by the shield plate 60, the second chip 70 is unlikely to be damaged and the quality of bonding of the second bonding wires 53 may be maintained in a wire bonding operation.

In an exemplary embodiment, the wiring substrate 30 is a multi-layer printed circuit board which includes a plurality of metal wiring layers 32 made of a metal such as, for example, copper (Cu). The metal wiring layers 32 include the ground layer 34a formed in a substrate body 31.

The substrate body 31 may be an insulating plate of a predetermined thickness that has an upper surface on which the first and second chips 40 and 70 are stacked and a lower surface opposite to the upper surface. The substrate body 31 may be made of materials such as, for example, prepreg, glass-epoxy resin, or bismaleimide triazine (BT) resin. The metal wiring layers 32 may include an upper wiring layer 33 formed at the upper surface of the substrate body 31, a lower wiring layer 35 formed at the lower surface of the substrate body 31, and an inner wiring layer 34 having the ground layer 34a formed in the substrate body 31. The upper, inner, and lower wiring layers 33, 34, and 35 may be electrically interconnected through vias 36a, 36b, and 36c penetrating the substrate body 31. The wiring substrate 30 may be formed by laminating a plurality of unit substrates. Each of the unit substrates includes one metal wiring layer 32 made by patterning copper foil attached on a single surface of the unit substrate, or includes two wiring layers 32 on double surfaces of the unit substrate. The wiring substrate 30 of the first embodiment is formed by laminating two unit substrates to each other, and includes three metal wiring layers 32.

The upper wiring layer 33 may include a chip mounting area 33a formed at a central region of the upper surface thereof, and substrate pads 33b and 33c formed around the chip mounting area 33a. It may be preferable that the chip mounting area 33a have a size sufficient to contain the entire lower surface of the first chip 40 for grounding the entire lower surface thereof. The lower wiring layer 35 may include a lower ground layer 35a formed below the surface having the chip mounting area 33a. In addition, the lower wiring layer 35 may include solder ball pads 35b and 35c formed around the lower ground layer 35a and electrically connected to the substrate pads 33b and 33c, respectively. The ground layer 34a of the inner wiring layer 34 may be formed in the substrate body 31 parallel to the upper surface of the substrate body 31. Furthermore, the ground layer 34a may be formed in the form of a plate or a wire corresponding to the form of the upper surface of the substrate body 31. Although the first embodiment illustrates only the ground layer 34a formed in the inner wiring layer 34, a power layer may be also formed in the inner wiring layer 34 in addition to the ground layer 34a.

The substrate pads 33b and 33c include a ground substrate pad denoted by reference symbol 33b, and a signal substrate pad denoted by reference symbol 33c. Corresponding to this, the solder ball pads 35b and 35c include a ground solder ball pad denoted by reference symbol 35b, and a signal solder ball pad denoted by reference symbol 35c. Additionally, a ground solder ball pad 35a' may be formed at the lower ground layer 35a.

The vias 36a, 36b, and 36c may include ground vias denoted by reference symbols 36a and 36b, and signal vias denoted by reference symbol 36c. A signal via 36c may be formed detached from the ground layer 34a, and may be used to interconnect a signal substrate pad 33c and signal solder ball pad 35c. The ground vias 36a and 36b may include a first ground via denoted by reference symbol 36a penetrating the substrate body 31 between the chip mounting area 33a and lower ground layer 35a, and a second ground via denoted by reference symbol 36b penetrating the substrate body 31 between a ground substrate pad 33b and ground solder ball pad 35b. The chip mounting area 33a, ground layer 34a, and lower ground layer 35a that are interconnected by the ground vias 36a and 36b may also act as heat-dissipating passages.

The insides of the vias 36a, 36b, and 36c may be electrolyses plated with copper. The inside of the first ground via 36a may be filled with a metal having thermal conductivity to enhance grounding and heat dissipation capabilities. Furthermore, it may be preferable to use a low melting point metal having electrical and thermal conductivity as the filling metal.

A protective layer 37 made of, for example, photo solder resist may be formed over the surfaces of the substrate body 31. The protective layer 37 may protect the upper and lower wiring layers 33 and 35 from the external environment. The chip mounting area 33a, substrate pads 33b and 33c, and solder ball pads 35a', 35b, and 35c may be exposed outwards from the protective layer 37. In addition, they may be plated with materials such as, for example, nickel-gold (Ni—Au), nickel-silver (Ni—Ag), or nickel-palladium (Ni—Pd).

Although the first embodiment illustrates the use of a printed circuit board as the wiring substrate 30, other materials such as, for example, a tape circuit substrate, ceramic substrate, silicon substrate, or leadframe may also be used as wiring substrate 30. For example, in the chip stack structure of FIG. 9 to be described later, a leadframe is utilized as a wiring substrate.

The lower surface of the first chip 40 may be attached on and grounded to the chip mounting area 33a through a conductive adhesive 42. The first chip 40 may be an edge pad type semiconductor chip having first electrode pads 41 located around the periphery of the upper surface thereof. The conductive adhesive 42 may be a liquid silver-epoxy adhesive or solder. Although the use of an edge pad type semiconductor chip as the first chip 40 is illustrated, other types of semiconductor chips may also be used as the first chip 40.

The first bonding wires 51 are used to electrically connect the first electrode pads 41 of the first chip 40 to the substrate pads 33c. The first bonding wires 51 may be formed through various bonding techniques such as, for example, ball bonding, wedge bonding, reverse bonding, and bump reverse bonding. In an exemplary embodiment, the bump reverse bonding may be preferred for minimizing the height of loops thereof. It may be preferable to control the loops of the first bonding wires 51 projecting above the upper surface of the first chip 40 to be less than or equal to 60 μm in height.

The shield plate 60 may include a reinforcement plate 61 having a predetermined level of conductivity, and a non-conductive adhesion layer 65 formed at the lower surface of the reinforcement plate 61. The reinforcement plate 61 may be large enough to cover the first chip 40 and a region of the wiring substrate 30 where the first bonding wires 51 are bonded. The adhesion layer 65 may be formed at the lower surface of the reinforcement plate 61 facing the upper surface of the first chip 40. The adhesion layer 65 may attach the reinforcement plate 61 on the upper surface of the first chip 40 in such a manner that the lower surface of the reinforcement plate 61 is detached from the first bonding wires 51.

The reinforcement plate 61 may be made of a metal plate of an iron-based or copper-based alloy that has relatively good electric conductivity and is capable of stably supporting the second chip 70 to be attached on the upper surface thereof. To obtain good wire bonding quality, the upper surface of the reinforcement plate 61 may be plated with material such as, for example, nickel-gold, nickel-silver, or nickel-palladium. In an exemplary embodiment, only a peripheral region of the upper surface of the reinforcement plate 61 where the wire bonding is actually performed may be plated.

The thickness of the adhesion layer 65 may be greater than the heights of those portions of the first bonding wires 51 projecting above the upper surface of the first chip 40. Such a thickness may place the portions of the first bonding wires 51 within the adhesion layer 65 in an operation of shield plate attachment. In an exemplary embodiment, the adhesion layer 65 of the shield plate 60 may be a non-conductive adhesive tape.

A shield plate-attachment process may be performed using a general chip-attachment facility by manufacturing a round plate similar to a wafer. That is, the round plate may include a plurality of shield plates 60 arranged separately in a grid form. A shield plate 60 may be separated from the round plate and stacked on the first chip 40. Hence, the first chip 40, shield plate 60, and second chip 70 may be stacked using existing chip-attachment facilities.

The grounding wire 52 may be used to electrically connect the reinforcement plate 61 of the shield plate 60 to a ground substrate pad 33b. One end of the grounding wire 52 may be bonded to a peripheral region of the upper surface of the plated-reinforcement plate 61.

The second chip 70 may be attached through an adhesive agent 72 to a central area of the shield plate 60 inside a portion where the grounding wire 52 is bonded. The second chip 70 may be an edge pad type semiconductor chip having second electrode pads 71 located around the periphery of the upper surface thereof. The adhesive agent 72 may be a conductive or non-conductive adhesive, and may be of a liquid or film type. For example, a silver-epoxy adhesive or solder may be used as a conductive adhesive, and an epoxy-based or silicone-based adhesive may be used as a non-conductive adhesive. Although the use of an edge pad type semiconductor chip as the second chip 70 is illustrated, other types of semiconductor chips may also be used as the second chip 70.

It is illustrated in the first embodiment that the first chip 40 is smaller than the second chip 70. The first chip 40 may be an RF device and the second chip 70 may be a baseband device.

The second bonding wires 53 may directly connect the second electrode pads 71 of the second chip 70 to the wiring substrate 30. A second bonding wire 53 may also directly connect a ground terminal among the second electrode pads 71 to the shield plate 60. Although not shown, a ground terminal among the second electrode pads 71 may be connected via the shield plate 60 to a ground substrate pad 33b of the wiring substrate 30 using a grounding wire 52 and second bonding wire 53. Specifically, a second bonding wire 53 may be formed to have one end thereof bonded to the ground terminal, a middle part bonded to the shield plate 60, and the other end bonded to a ground substrate pad 33b of the wiring substrate 30. Furthermore, a signal terminal among the second electrode pads 71 may be connected to a corresponding signal substrate pad 33c through a second bonding wire 53.

Consequently, the first chip 40 and first bonding wires 51 are hidden and shielded by the shield plate 60, which is grounded to the ground layer 34a, thereby suppressing signal interference between the first chip 40 and second chip 70 mounted on the shield plate 60. In particular, even though an RF device may be used as the first chip 40, the RF device is shielded by the shield plate 60. Thus, low impedance properties may be obtained. The shield plate 60 may also act to isolate the first chip 40 from the second chip 70.

In addition, the shield plate 60 may support the second chip 70. Hence, in a wire bonding operation, the second chip 70 is unlikely to be damaged and the quality of bonding may be maintained even though an overhang structure may result from the first chip 40 being smaller than the second chip 70.

Figure 5:
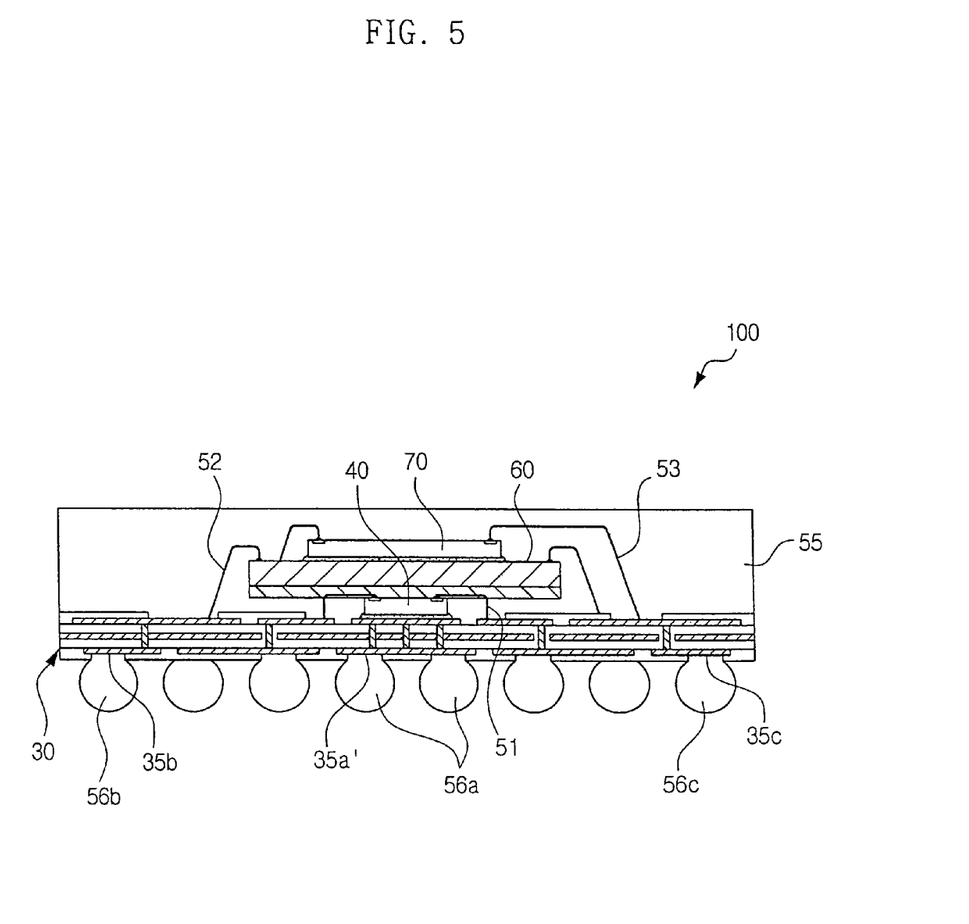
FIG. 5 is a sectional view showing a SIP module using the chip stack structure of FIG. 3.

FIG. 5 shows a SIP module 100 using the above-described chip stack structure according to the first embodiment of the present invention. Referring to FIG. 5, the SIP module 100 according to the first embodiment is a ball grid array (BGA) type package having a plurality of solder balls 56a, 56b, and 56c formed at the lower surface of the wiring substrate 30. Solder balls 56a, 56b, and 56c may serve as external interface terminals. The first chip 40, second chip 70, shield plate 60, and bonding wires 51, 52, and 53 formed on the upper surface of the wiring substrate 30 may be encapsulated by a molding compound 55, and thereby protected from the external environment. The molding compound 55 may be made from a variety of materials such as, for example, liquid molding resin. The solder balls 56a, 56b, and 56c may be formed at the solder ball pads 35a', 35b, and 35c, respectively, in the lower surface of the wiring substrate 30.

The molding compound 55 may be made from liquid epoxy-based molding resin using various molding methods such as, for example, a transfer molding, or potting method. The molding compound 55 may protect the first chip 40, second chip 70, shield plate 60, and bonding wires 51, 52, and 53 from the external environment.

The solder balls 56a, 56b, and 56c may be formed by coating flux on the solder ball pads 35a', 35b, and 35c, respectively, applying ball-shaped solder ball material on the solder ball pads 35a', 35b, and 35c, and reflowing the ball-shaped solder ball material. The solder balls 56a, 56b, and 56c may include a signal solder ball denoted by reference symbol 56c, and ground solder balls denoted by reference symbols 56a and 56b. The shield plate 60 may be grounded through the ground solder balls 56a and 56b formed at the ground solder ball pads 35a' and 35b, respectively. In an alternative exemplary embodiment, instead of the solder balls 56a, 56b, and 56c, nickel (Ni) or gold (Au) bumps may be formed.

Second Embodiment

Figure 6:
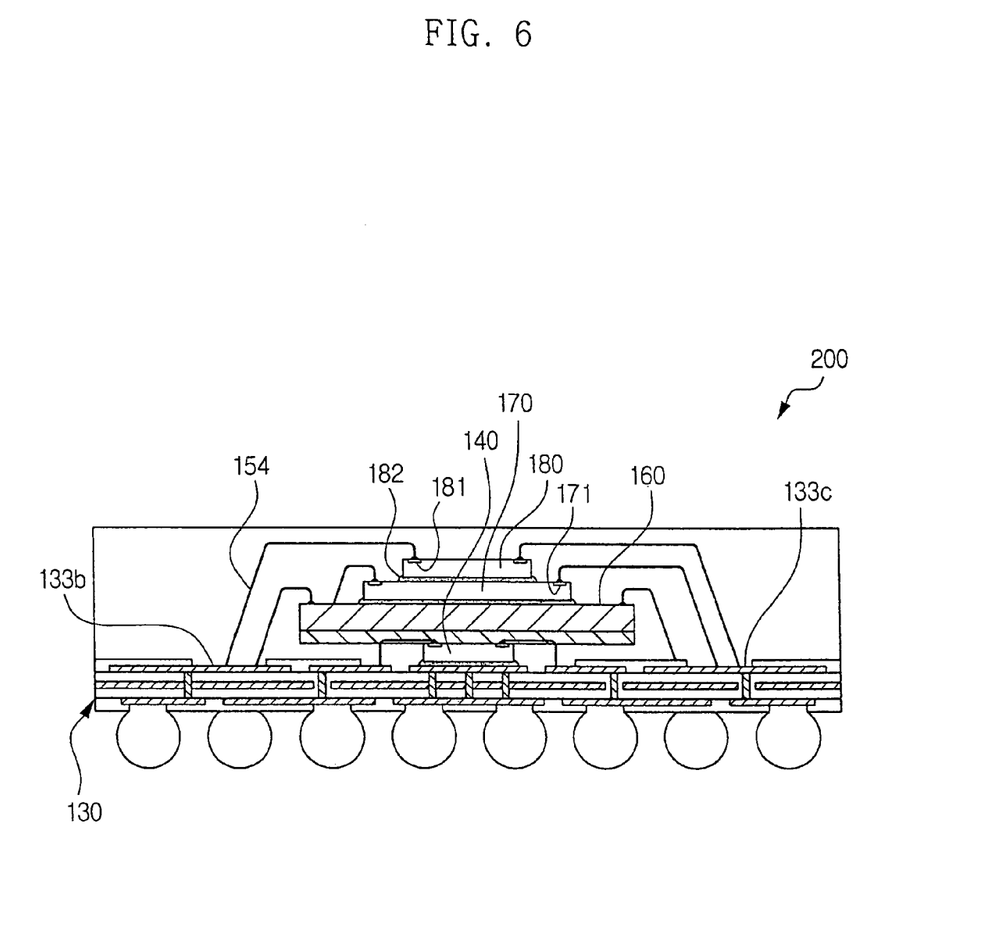
FIG. 6 is a sectional view showing another SIP module using a chip stack structure having a shielding capability according to a second embodiment of the present invention.

Although the first embodiment of the present invention discloses two stacked semiconductor chips, at least one semiconductor chip 180 may be further stacked on a second chip 170, as shown in FIG. 6.

Referring to FIG. 6, a SIP module 200 according to the second embodiment includes a third chip 180 stacked on the second chip 170. The chip stack structure including a first chip 140, the second chip 170, and a shield plate 160 is the same as that of the first embodiment, and a repetitive description thereof is thus omitted herein. Hereinafter, the description focuses on a structure further including the third chip 180.

The third chip 180 may be attached to a region inside second electrode pads 171 of the second chip 170 through an adhesive agent 182. The third chip 180 may be an edge pad type semiconductor chip having third electrode pads 181 located around the periphery of the upper surface thereof. The adhesive agent 182 may be a non-conductive adhesive of a liquid or film type. For example, an epoxy-based or silicone-based non-conductive adhesive may be used as the adhesive agent 182.

Various types of chips may be used in the chip stack structure according to the second embodiment. For example, an RF device may be used as the first chip 140, a baseband device may be used as the second chip 170, and a NOR flash device may be used as the third chip 180.

Third bonding wires 154 may directly connect the third electrode pads 181 of the third chip 180 to substrate pads 133b and 133c of a wiring substrate 130. Although not shown, a third bonding wire 154 can directly connect a ground terminal among the third electrode pads 181 to the shield plate 160. A ground terminal among the third electrode pads 181 may be connected via the shield plate 160 to a ground substrate pad denoted by reference symbol 133b of the wiring substrate 130 using a third bonding wire 154. Furthermore, a second electrode pad 171 may be directly connected to a third electrode pad 181 through a third bonding wire 154 (not shown.)

Third Embodiment

Figure 7:
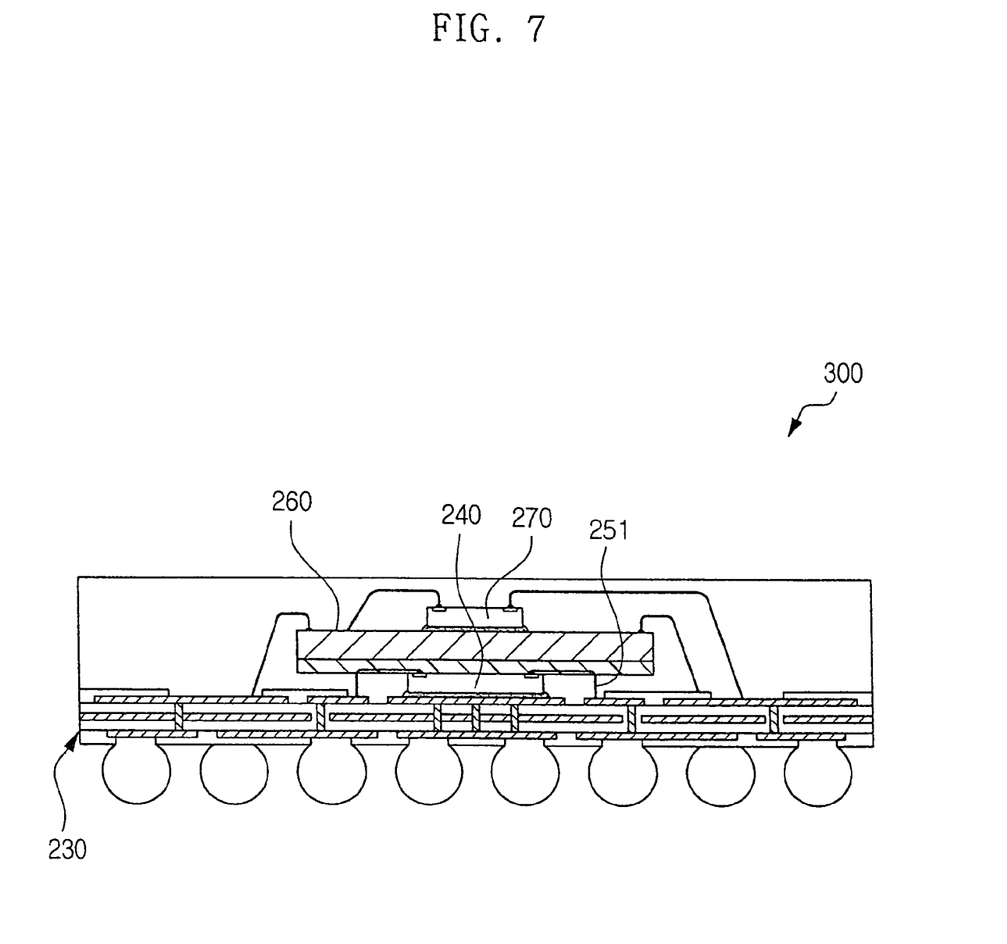
FIG. 7 is a sectional view showing another SIP module using a chip stack structure having a shielding capability according to a third embodiment of the present invention.

Although the second chip stacked on the first chip is larger than the first chip in the first or second embodiment, a first chip 240 may be larger than a second chip 270, as shown in FIG. 7.

Referring to FIG. 7, a SIP module 300 according to the third embodiment includes a first chip 240, a shield plate 260 stacked on the first chip 240, and a second chip 270 stacked on the shield plate 260. The shield plate 260 may be large enough to cover the first chip 240 and a region of a wiring substrate 230 where first bonding wires 251 are bonded.

Consequently, the first chip 240 and first bonding wires 251 are hidden and shielded by the grounded shield plate 260, thereby suppressing signal interference between the first chip 240 and second chip 270 mounted on the shield plate 260. In addition, other effects similar to those of the chip stack structure according to the first embodiment may be expected.

Fourth Embodiment

Figure 8:
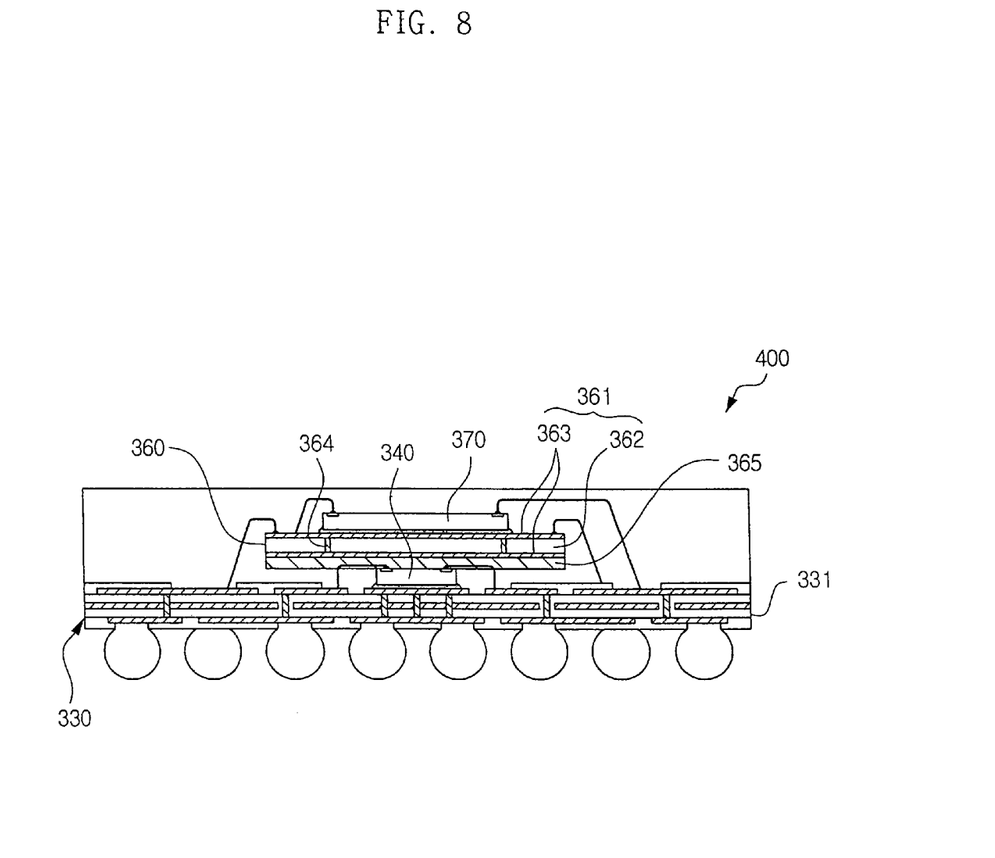
FIG. 8 is a sectional view showing another SIP module using a chip stack structure having a shielding capability according to a fourth embodiment of the present invention.

Although the shield plate disclosed in the first, second and third embodiments of the present invention includes a reinforcement plate made of metallic materials, a shield plate 360 may include a reinforcement plate 361, as shown in FIG. 8, having an insulating layer 362 and metal layers 363 attached to two surfaces of the insulating layer 362.

Referring to FIG. 8, a SIP module 400 according to the fourth embodiment has substantially the same chip stack structure as that in the first embodiment, including a first chip 340, the shield plate 360 stacked on the first chip 340, and a second chip 370 stacked on the shield plate 360. Because the shield plate 360 has a different configuration from that of the shield plate of the first embodiment, a description of the present embodiment hereinafter focuses on the shield plate 360.

The shield plate 360 may include the reinforcement plate 361 of a predetermined size and a non-conductive adhesion layer 365 formed at the lower surface of the reinforcement plate 361. The reinforcement plate 361 may include the insulating layer 362 of a predetermined thickness, and metal layers 363 attached to the two surfaces of the insulating layer 362. The two metal layers 363 may be electrically connected to each other through vias 364 penetrating the insulating layer 362.

Materials constituting a substrate body 331 of a wiring substrate 330 may also be used for the insulating layer 362. Furthermore, the metal layers 363 may be made of materials such as, for example, a copper-based alloy, or iron-based alloy.

Fifth Embodiment

Figure 9:
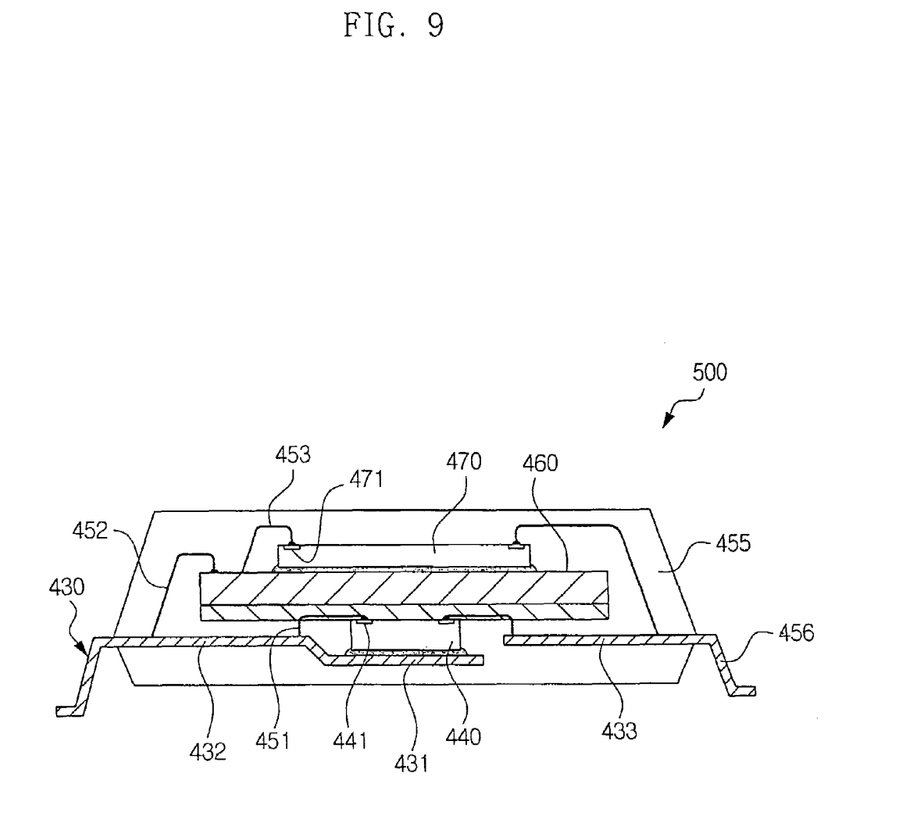
FIG. 9 is a sectional view showing another SIP module using a chip stack structure having a shielding capability according to a fifth embodiment of the present invention.

Although the first to fourth embodiments of the present invention disclose the use of a printed circuit board as the wiring substrate, a leadframe having a die pad 431 may also be used as the wiring substrate, as shown in FIG. 9.

Referring to FIG. 9, a SIP module 500 comprises a first chip 440 stacked on the die pad 431 of a wiring substrate 430, a shield plate 460 stacked on the first chip 440, and a second chip 470 stacked on the shield plate 460.

The wiring substrate 430 may include the die pad 431 and leads 432 and 433 arranged around the die pad 431. Specifically, a ground lead denoted by reference symbol 432 among the leads 432 and 433 may be connected to the die pad 431, which acts as a ground layer. To ground the die pad 431, a bonding wire may also be used to connect the die pad 431 to a ground lead 432 detached from the die pad 431.

The leads 432 and 433 may include a ground lead 432 and a signal lead denoted by reference symbol 433. At least one of the ground leads 432 is connected to the die pad 431. The signal lead 433 may be detached from the die pad 431.

A ground terminal among first electrode pads 441 of the first chip 440 may be connected to the corresponding ground lead 432 through a first bonding wire 451. The shield plate 460 may be connected to a ground lead 432 through a grounding wire 452. A ground terminal among second electrode pads 471 of the second chip 470 may be connected to the shield plate 460 through a second bonding wire 453. A second bonding wire 453 may also be used to connect a ground terminal among the second electrode pads 471 to a corresponding ground lead 432 directly or via the shield plate 460.

The die pad 431, first chip 440, second chip 470, shield plate 460, bonding wires 451, 452, and 453, and portions of the leads 432 and 433 may be encapsulated by a molding compound 455 and thereby protected from the external environment. The molding compound 455 may be made from materials such as, for example, liquid molding resin.

Portions of the leads 432 and 433 projecting out of the molding compound 455 may be bent according to a mount type, and may be used as external interface terminals 456. Although the present embodiment discloses the use of gull-wing type leads, other types of leads may also be used.

Consequently, the first chip 440 may be grounded to the die pad 431, and the first chip 440 and first bonding wires 451 may be hidden and shielded by the grounded shield plate 460. Thus, the same effects as those of the chip stack structure according to the first embodiment may be expected.

As apparent from the above description, the present disclosure provides a chip stack structure, wherein first bonding wires in addition to a first chip are shielded by a grounded shield plate and a second chip is mounted on the shield plate, thereby electrically isolating the first chip and the second chip from each other. Consequently, performance degradation of a SIP module due to signal interference between the first chip and second chip may be suppressed.

The shield plate may also act to support the second chip attached thereon. Hence, in a wire bonding operation, the second chip is unlikely to be damaged and the quality of bonding may be maintained even though an overhang structure may result from the second chip being larger than the first chip.

Furthermore, wire bonding may be used for the electrical connections and the first chip, shield plate, and second chip may be stacked in order using general chip-attachment facilities. Thus, manufacturing costs of the SIP module may also be lowered.

The present invention is disclosed in the preferred embodiments shown in this specification and in the accompanying drawings. This disclosure is not to limit the scope of the invention, but to serve only for illustrative purposes. It should be understood to the ordinary person skilled in the art that various changes or modifications of the embodiments are possible without departing from the spirit of the invention. It is intended that the specification and the examples be considered exemplary only, with a true scope of the disclosure being indicated by the following claims and their equivalents.

What is claimed is:

1. A chip stack structure having a shielding capability, comprising:
    a wiring substrate, the wiring substrate including a ground layer;
    a first chip attached on an upper surface of the wiring substrate and having first electrode pads;
    a plurality of first bonding wires which electrically connect the first electrode pads of the first chip to the wiring substrate;
    a shield plate positioned on the first chip, the shield plate comprising a conductive reinforcement plate and a non-conductive adhesion layer attaching the conductive reinforcement plate to the first chip, wherein a size of the non-conductive adhesion layer is larger than a size of the first chip and the non-conductive adhesion layer is formed entirely of the same material, wherein the plurality of first bonding wires do not contact a bottom surface of the conductive reinforcement plate;
    a grounding wire which connects the shield plate to the ground layer of the wiring substrate;
    a second chip attached to and supported by the shield plate;
    a second bonding wire which connects the second chip directly to a signal substrate pad of the wiring substrate; and
    a third bonding wire which connects the second chip to the shield plate, grounding the second chip via the grounding wire which connects the shield plate to the ground layer of the wiring substrate,
    wherein the non-conductive adhesion layer of the shield plate contacts a portion of at least one of the plurality of the first bonding wires and the first electrode pads, and the conductive reinforcement plate is detached from the at least one of the plurality of first bonding wires.

2. The chip stack structure of claim 1, further comprising a conductive adhesive which attaches the first chip to the upper surface of the wiring substrate and electrically connects the first chip to the ground layer of the wiring substrate.

3. The chip stack structure of claim 2, wherein the conductive reinforcement plate covers the first chip and a region of the wiring substrate where the plurality of first bonding wires are bonded; and
    the non-conductive adhesion layer isolates a lower surface of the reinforcement plate from the at least one of the plurality of first bonding wires.

4. The chip stack structure of claim 3, wherein at least a region of an upper surface of the reinforcement plate where the grounding and third bonding wires are bonded is plated with at least one of nickel-gold, nickel-silver, and nickel-palladium.

5. The chip stack structure of claim 4, wherein a thickness of the adhesion layer of the shield plate is greater than heights of the plurality of first bonding wires above the upper surface of the first chip.

6. The chip stack structure of claim 5, wherein the adhesion layer of the shield plate is a non-conductive adhesive tape.

7. A chip stack structure comprising:
a first, chip attached to a top surface of a wiring substrate and having first electrode pads which are electrically connected to the wiring substrate through a plurality of first bonding wires;
a shield plate positioned on the first chip and electrically connected to a ground layer of the wiring substrate through a grounding wire, the shield plate comprising a conductive reinforcement plate, covering the first chip and a region of the wiring substrate where the plurality of first bonding wires are bonded, and being detached from at least one of the plurality of first bonding wires and a non-conductive adhesion layer, positioned between the conductive reinforcement layer and the first chip, the non-conductive adhesion layer isolating the conductive reinforcement plate from the plurality of first bonding wires and and contacting a portion of the at least one of the plurality of first bonding wires and the first electrode pads, and being formed entirely of the same material, wherein the plurality of first bonding wires do not contact a bottom surface of the conductive reinforcement plate;
a second chip attached to and supported by the shield plate and electrically connected to a signal substrate pad of the wiring substrate directly through a second bonding wire and to the ground layer of the wiring substrate via the shield plate through a third bonding wire and the grounding wire, the third bonding wire connecting the second chip to the shield plate and the grounding wire connecting the shield plate to the ground layer; and
a conductive adhesive attaching the first chip to the top surface of the wiring substrate and electrically connecting the first chip to the ground layer of the wiring substrate;
wherein the reinforcement plate of the shield plate comprises:
an insulating layer;
metal layers formed at two surfaces of the insulating layer; and
vias penetrating the insulating layer to interconnect the metal layers.

8. The chip stack structure of claim 1, wherein the first chip is smaller than the second chip.

9. The chip stack structure of claim 8, wherein the first chip is a radio frequency (RF) device and the second chip is a baseband device.

10. The chip stack structure of claim 8, further comprising at least one semiconductor chip stacked on the second chip.

11. The chip stack structure of claim 1, wherein the first chip is larger than the second chip.

12. The chip stack structure of claim 11, further comprising at least one semiconductor chip stacked on the second chip.

13. The chip stack structure of claim 1, wherein the wiring substrate is any one of a printed circuit board, tape circuit substrate, ceramic substrate, silicon substrate, and leadframe.

14. A system-in-package module having a shielding capability, comprising:
a chip stack structure having a shielding capability comprising:
a wiring substrate, the wiring substrate including a ground layer;
a first chip attached on an upper surface of the wiring substrate and having first electrode pads;
a plurality of first bonding wires which electrically connect the first electrode pads of the first chip to the wiring substrate;
a shield plate positioned on the first chip, the shield plate comprising a conductive reinforcement plate and a non-conductive adhesion layer attaching the conductive reinforcement plate to the first chip, wherein a size of the non-conductive adhesion layer is larger than a size of the first chip and the non-conductive layer is formed entirely of the same material, wherein the plurality of first bonding wires do not contact a bottom surface of the conductive reinforcement plate;
a grounding wire which connects the shield plate to the ground layer of the wiring substrate;
a second chip attached to and supported by the shield plate;
a second bonding wire which connects the second chip directly to a signal substrate pad of the wiring substrate;
a third bonding wire which connects the second chip to the shield plate, grounding the second chip via the grounding wire which connects the shield plate to the ground layer of the wiring substrate;
a molding compound which encapsulates the first chip stacked on the wiring substrate, the second chip, and the first, second, and third bonding wires; and
a plurality of external interface terminals formed outside the molding compound and connected to the wiring substrate,
wherein the non-conductive adhesion layer of the shield plate contacts a portion of at least one of the plurality of first bonding wires and the first electrode pads, and the conductive reinforcement plate is detached from the at least one of the plurality of first bonding wires.

15. The system-in-package module of claim 14, wherein the first chip is smaller than the second chip.

16. The system-in-package module of claim 15, wherein the first chip is a radio frequency (RF) device and the second chip is a baseband device.

17. The system-in-package module of claim 15, further comprising at least one semiconductor chip stacked on the second chip.

18. The system-in-package module of claim 14, wherein the first chip is larger than the second chip.

19. The system-in-package module of claim 18, further comprising at least one semiconductor chip stacked on the second chip.

20. The system-in-package module of claim 14, wherein the wiring substrate is any one of a printed circuit board, tape circuit substrate, ceramic substrate, silicon substrate, and leadframe.

* * * * *